United States Patent [19]

Sawaya

[11] Patent Number: 5,083,189
[45] Date of Patent: Jan. 21, 1992

[54] RESIN-SEALED TYPE IC DEVICE

[75] Inventor: Hiromichi Sawaya, Kawasaki, Japan

[73] Assignee: Kabushiki Kaisha Toshiba, Kawasaki, Japan

[21] Appl. No.: 506,251

[22] Filed: Apr. 9, 1990

Related U.S. Application Data

[63] Continuation-in-part of Ser. No. 174,434, Mar. 28, 1988, abandoned.

[30] Foreign Application Priority Data

Mar. 31, 1987 [JP] Japan .................. 62-76175
Mar. 31, 1987 [JP] Japan .................. 62-76176
Mar. 31, 1987 [JP] Japan .................. 62-78550

[51] Int. Cl.⁵ .................. H01L 23/28; H01L 23/16
[52] U.S. Cl. ........................ 357/72; 357/75
[58] Field of Search .................. 357/72, 75

[56] References Cited

U.S. PATENT DOCUMENTS 3,388,301  6/1988  James .................. 357/75
3,469,148  9/1969  Lund .................. 357/75
4,074,342  2/1978  Honn et al. .................. 357/75
4,506,238  3/1985  Endoh et al. .................. 357/72

FOREIGN PATENT DOCUMENTS 0071166  5/1982  Japan .................. 357/75
0023531  2/1984  Japan .................. 357/75
189958   9/1985  Japan .
226649  10/1985  Japan .
0024255  2/1986  Japan .................. 357/75
0272956 12/1986  Japan .................. 357/72

Primary Examiner—Eugene R. LaRoche
Assistant Examiner—Michael B. Shingleton
Attorney, Agent, or Firm—Finnegan, Henderson, Farabow, Garrett, and Dunner

[57] ABSTRACT

A resin-sealed type integrated circuit device is disclosed which comprises an island constituting a lead frame, and a plurality of hybrid units which, together with the island, are integrally sealed with a resin. The device has the advantages of simplicity of design and reduced size, but without any loss of quality.

6 Claims, 5 Drawing Sheets

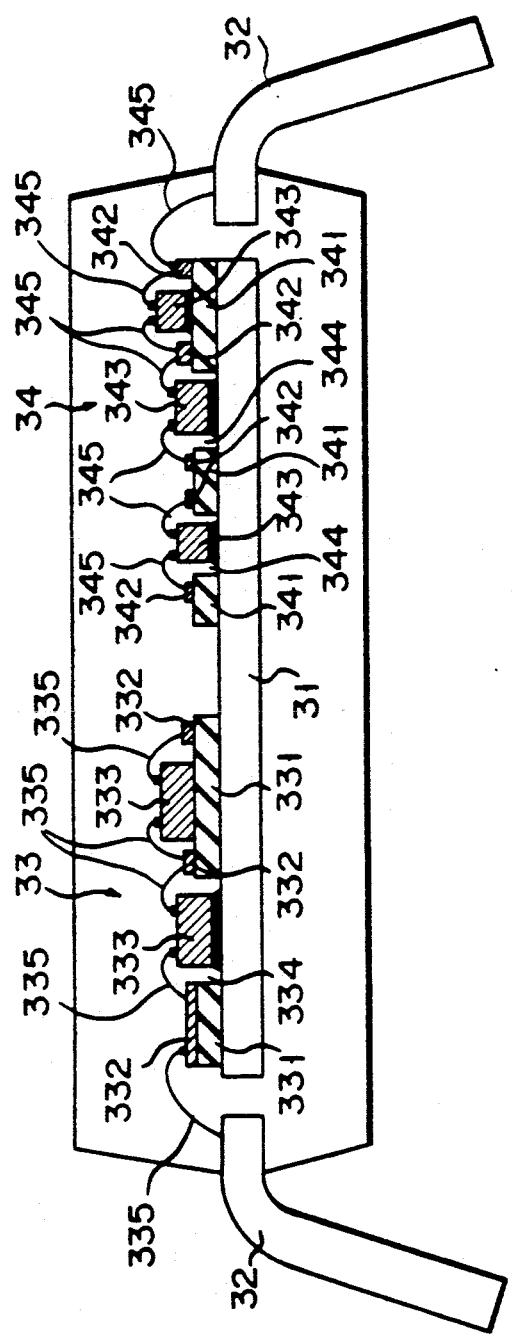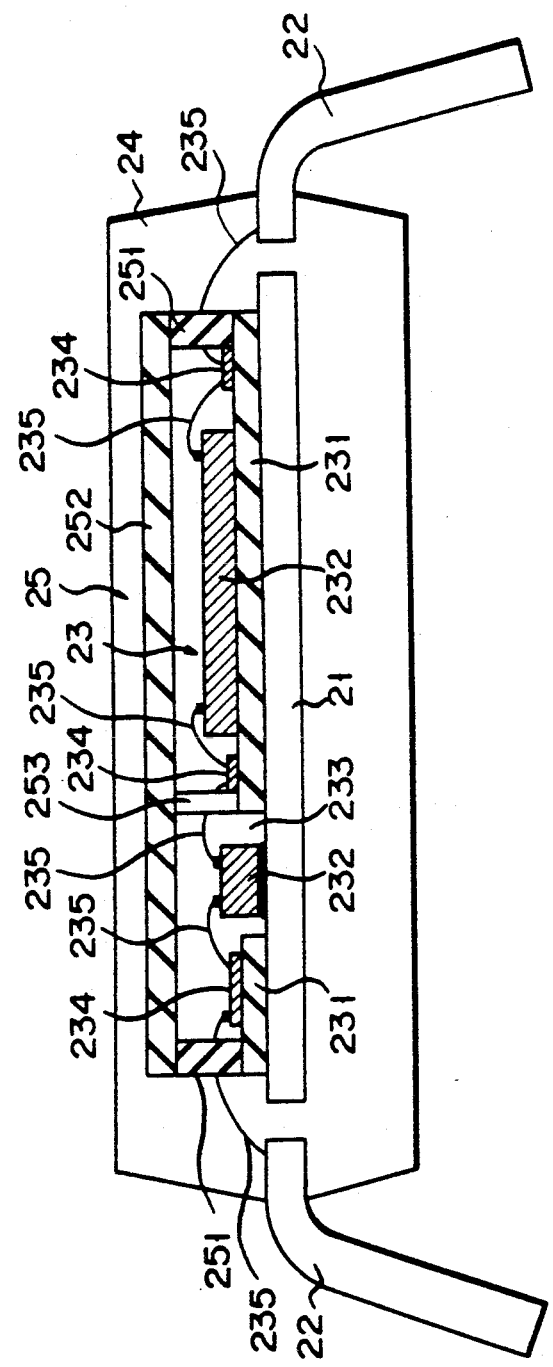

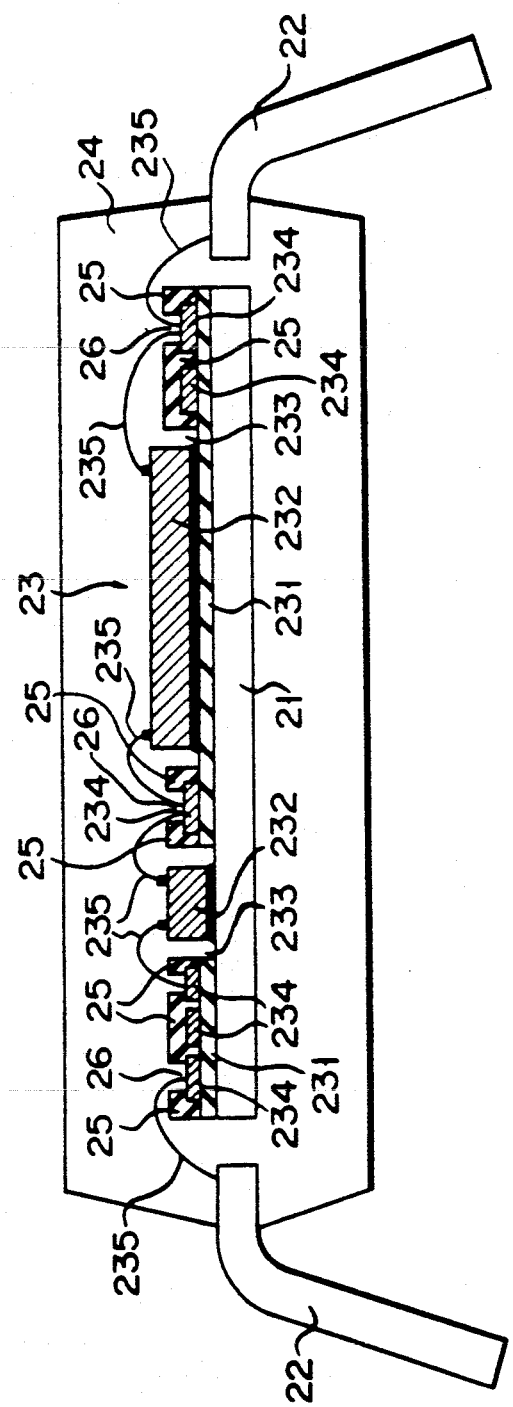
F I G. 6
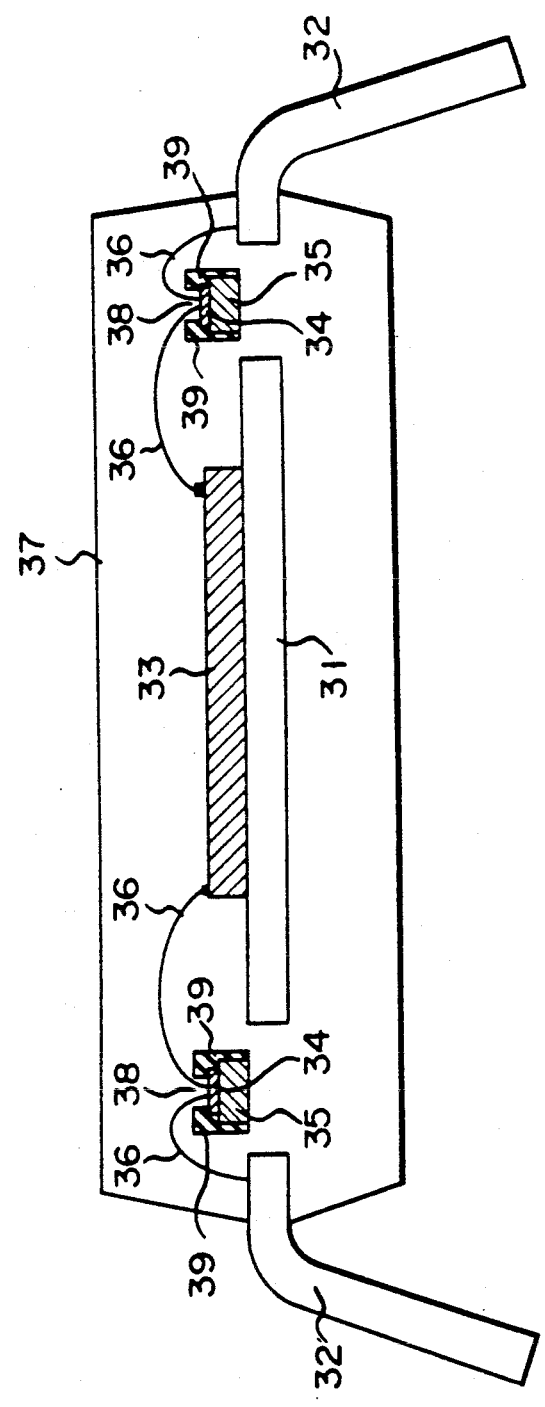
F I G. 7

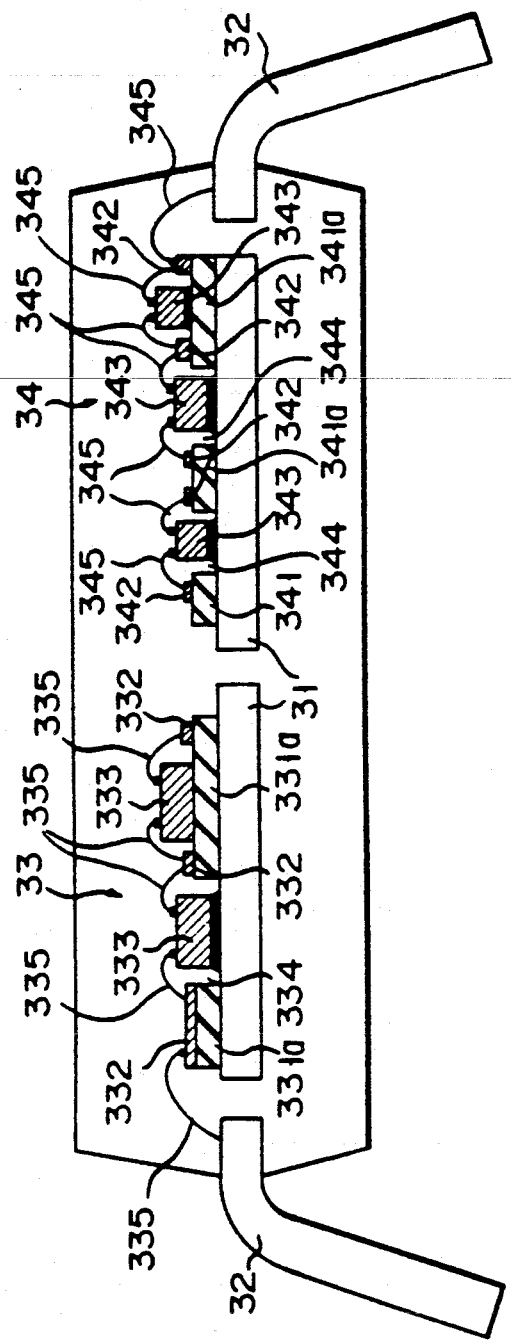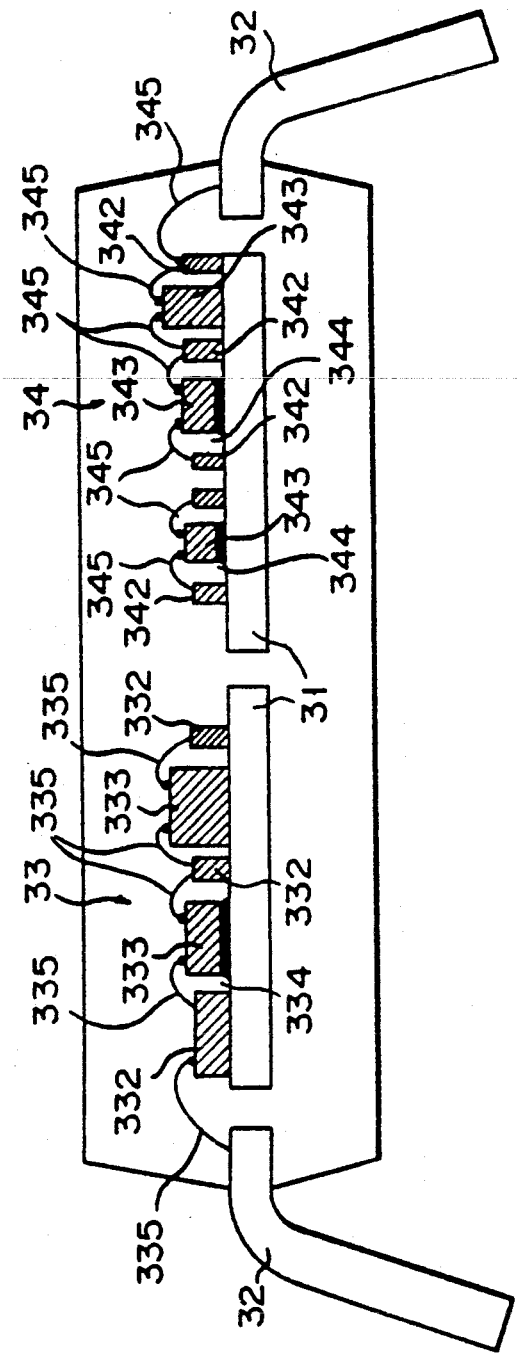
FIG. 8
FIG. 9

RESIN-SEALED TYPE IC DEVICE

BACKGROUND OF THE INVENTION

This application is a continuation-in-part, of application Ser. No. 07/174,434, filed Mar. 28, 1988 abandoned.

FIELD OF THE INVENTION

This invention relates to a resin-sealed type IC device which is obtained by resin-sealing a semiconductor chip against dirt intrusion, with a semiconductor circuit formed over an island (a lead frame).

DESCRIPTION OF THE RELATED ART

In general, two sealing methods are known for sealing integrated circuits. These are a hermetic sealing method and a resin sealing method.

FIG. 1 is a cross-sectional view showing a conventional resin-sealed type semiconductor device. In FIG. 1, reference numeral 11 denotes an island constituting a lead frame; 12 denotes lead wire; 13 denotes an integrated circuit bonded to island 11; and 14 denotes a resin-seal package for integrally sealing island 11, lead wire 12 and integrated circuit 13.

Integrated circuit 13 is, for example, a hybrid type comprising insulating substrate 131 which is adhesively bonded to island 11, and a hybrid unit, formed on substrate 131 and comprising a plurality of semiconductor chips 132 which are adhesively bonded to substrate 131, and a plurality of conductor interconnection layers 133 which are formed on substrate 131. The hybrid unit also has wires 134 which are suitably connected between conductor interconnection layer 133 and a corresponding electrode of a semiconductor element on semiconductor chip 132 and between conductor interconnection layer 133 and lead wire 12.

FIG. 2 is a cross-sectional view showing another conventional resin-sealed type semiconductor device. The semiconductor device of FIG. 1 is substantially the same as that of FIG. 2, except that holes 135 are formed in insulating substrate 131 and that some of a plurality of semiconductor chips 132 are adhesively bonded directly to island 11 through holes 135.

As regards the aforementioned resin-sealed type IC device, there has been, over time, a general tendency toward incorporating more and more semiconductor chips 132 on the insulating substrate, in order that an increasing number of functions can be performed, the inevitable result of this being that the insulating substrate becomes ever more bulky. This development has given rise to the following problems:

(1) When the insulating substrate becomes ever more bulky, it then becomes difficult to ascertain precisely the input/output characteristics of each of the plurality of circuit blocks formed thereon. Nor can such an IC device be easily designed such that the input/output characteristics of the various circuit blocks can be ascertained with ease. This state of affairs constitutes a major obstacle to the advent of low-cost, quickly-deliverable hybrid type devices which can satisfy the individual requirements of a variety of customers. One attempt at overcoming this problem has been to design the devices such that their patterns are arranged in the form of cells, but it is very difficult to realize the hybrid type devices.

(2) A large-sized equipment is required for manufacturing IC devices. More precisely, in order to enhance the reliability at a location where island 11 is bonded to insulating substrate 131, insulating substrate 131 needs to be bonded to island 11 by means of an adhesive agent which is cured at that time under a predetermined pressure and temperature. In this case, the pressure level required should be proportional to the area of the substrate; in other words, the larger the area of the insulating substrate, the greater is the pressure required. It is, naturally, necessary to provide an apparatus for producing a pressure of, for example, about 10 kg/cm$^2$ and hence a much greater manufacturing apparatus for that purpose. Thus there are various problems, such as an increase in the size of the insulating substrate and in the installation space and in costs involved.

(3) Furthermore, there is a possibility that finished devices will be made lower in quality. If, for example, insulating substrate 131 is bonded to island 11, no pressure is uniformly exerted over the substrate as a whole due to the bulkiness of the insulating substrate 131 so that no adequate bond can reliably be obtained between the insulating substrate and the island. The adhesive agent, after being cured, is liable to contain voids therein, thus being subject to a great expansion and contraction under a varying temperature and humidity. Thus there is a high chance that the devices manufactured in this way will not be able to properly be used in the serving circumstances after they have been resin-sealed.

(4) As there is a growing demand for semiconductor devices having a wide variety of different functions, semiconductor elements are integrated in a high integration density with an attendant decrease in their occupation area of semiconductor interconnection and in their associated conductor interconnection layer 133. When a resin is to be closely bonded directly to semiconductor chip 132, there is a risk that conductor interconnection layer 133 will be broken or short-circuit due to the thermal stress involved.

Though conventional resin-sealed IC devices are well-protected against dirt, they nevertheless have the following disadvantages:

(1) The devices manufactured have a poor moisture-resistant characteristics, such as the intrusion of moisture into the package and malfunction of the devices due to leakage current.

In those surface mount device packages, such as flat packages, quad flat packages, small outline packages and plastics leaded chip carriers, where one surface of a printed circuit board is bonded to an island directly, that is, without connecting the former to the latter by providing holes in the printed circuit board and filling them with a solder, they are liable to produce a defect, such as a poor bond, between the resin and the semiconductor chip 132 by thermal stress at the time of soldering, so that the development of defects are accelerated due to the penetration of moisture.

(2) The breakage of semiconductor device is progressed due to the penetration of moisture through the package, giving rise to a mulfunction at a shorter period of time.

Upon the penetration of the moisture through the package, there is a possibility that leakage current will flow across conductor interconnection layer 133 at a boundary surface between the resin 14 and insulating substrate 131. An increase in the leakage current results in a malfunction of the semiconductor devices. In the case of the resin-sealed type IC devices, more moisture are penetrated in the devices and more malfunction occurs at a shorter time. These phenomena become pronounced in particular when conductor interconnection layers 133 become narrowed at their intervals due to the high integration density of the devices.

For example, it has been found that, upon conducting long-duration reliability tests by a vapor pressure procedure at an interconnection distance 0.2 mm to 1.0 mm and an impression voltage of about 30V across the interconnection layers in the case of dual-in line packages (DIP), leakage current reaches a value of the order of 10 $\mu$A at around 100 hours and the packages fail to perform their function well. This short service life offers a reliability problem on the surface-mount thin type resin-sealed IC devices on the market. It is essentially necessary that, in order for the resin-sealed type semiconductor IC devices to be used extensively and distributed widely, their effective service life be further extended.

(3) The percentage of bonding is lowered due to the bulkiness of semiconductor chips 132 and to an increase in the number of semiconductor chips 132 to be bonded to insulating substrate 13. By the percentage of bonding is meant an internal pressure (stress), per unit area of semiconductor chips, suffered from a "cured" resin. That is, in order to avoid an erroneous operation of the circuit elements resulting from the emission of $\alpha$ rays, semiconductor chips 132, such as memories, are often coated with an insulating material, such as polyimides, so as to effect a better bond with resin 14. Semiconductor chips 132 of discrete component parts, such as resistors and capacitors, are often not coated with the aforementioned insulating material from the standpoint of sales costs involved. Thus the semiconductor chips 132 show a bad bond to resin 14. These factors produce a lowered bond with resin 14 due to the bulkiness of semiconductor chips 132 of discrete component parts and to an increase in their numbers. The lowered moisture-resistant characteristics are thus involved owing to the aforementioned bond.

(4) There is a high risk that a malfunction will also occur on the devices due to either connection breakage or a twist resulting from the generation of thermal stress and to a short-circuiting in a worst case. This mulfunction may occur particularly in the case where conductor interconnection layers 133 are formed of a soft material and arranged at a narrow interval such that with their width is reduced. It has been confirmed that the connection breakage and twist are produced by repetitively performing a temperature cycle of $-65°/200°$ C. for 30 minutes on devices which have those interconnection layers of, for example, under 100 $\mu$m.

(5) There is a high risk that a short-circuiting will occur due to a deformation, such as a sag, produced in wires 134 which are run across conductor interconnection layers 133.

(6) When the area ratio of conductor interconnection layer 133 to insulating substrate 131 is increased, it becomes difficult to achieve a firm bond between the two because insulating substrate 131 and conductor interconnection layer 133 are made of a resin and metal, respectively. A decrease in the bonding strength gives rise to the aforementioned problem (1).

(7) Due to the direct contact of semiconductor chip 132 to resin 14 it is difficult to mount semiconductor chips 132 on an oscillation producing device, such as a surface acoustic wave element.

Therefore, the bulk of the insulating substrate of the conventional resin-sealed type IC device gives rise to a number of different problems, such as difficulty in design, the bulkiness of manufacturing apparatuses and the downgrading of finished devices.

As will be appreciated from the above, conventional resin-sealed type IC circuits are accompanied by a number of drawbacks such as the ease with which they malfunction due to the penetration of moisture, the ready occurrence of breakage or short-circuiting owing to the thermal stress and to deformed wires, and the lowered bond resulting from an increased area ratio between the conductor interconnection layer and the resin.

SUMMARY OF THE INVENTION

It is accordingly the object of the present invention to provide resin-sealed type IC (integrated circuit) device which is relatively simple in design and of reduced size, this being achieved without any loss of quality.

Another object of the present invention is to provide a resin-sealed type IC device having a high degree of reliability.

According to the present invention, a resin-sealed type IC device is provided which is obtained by forming a plurality of insulating substrates on an island constituting a lead frame and a corresponding number of hybrid units, and integrally sealing the plurality of hybrid units within a resin seal package.

According to the present invention, even if there is an increase in the number of semiconductor chips to be mounted, individual insulating substrates to be incorporated into the device can be miniaturized by properly setting the substrates within the device with respective circuit blocks arranged in a proper fashion.

In the device of the present invention, a storage unit for storing an integrated circuit in a noncontacting fashion is formed of an insulating material and a resultant structure is resin-sealed from outside.

In the device of the present invention, the intrusion of moisture occupied within the package into a conductor interconnection layer is prevented by the storage unit. As a result, the malfunction of the device resulting from the intrusion of moisture can be suppressed to the lowest possible extent. Since the transmission of a thermal stress directly to the conductor interconnection layer can be prevented by the storage unit, a breakage or short-circuiting of the conductor interconnection layer resulting from the development of the thermal stress can be suppressed to the greatest possible extent.

According to the present invention, the semiconductor chip can be mounted in a device, such as a surface acoustic wave resonator, because the integrated circuit is held within the storage unit in a noncontacting fashion.

Furthermore, the storage unit is formed of an insulating material and thus the percentage of a resin bond can be prevented from being lowered even if there is an increase in the size of uncoated semiconductor chips and in the number of semiconductor chips.

In the device of the present invention, the conductor layer is covered with an insulating film which has a hole at a location corresponding to an electrode connection portion of the conductor layer.

In order to obtain the aforementioned arrangement, the insulating film having a hole at a location corresponding to the electrode connection portion of the conductor layer is covered on the conductor layer and then a wire is connected to an associated parts through that hole.

According to the aforementioned arrangement, the moisture intruded into the interior of the package is prevented from reaching the conductor layer by an insulating film which has been covered on the conductor layer. The malfunction of the device resulting from the intrusion of moisture can be prevented to the lowest possible extent.

Furthermore, a thermal stress developed can be prevented from being transmitted directly to the conductor layer, thus suppressing a breakage or short-circuiting in the conductor interconnection layer to the lowest possible extent.

It is also possible to, due to the presence of an insulating film, prevent a wire from contacting with a conductor layer and thus to suppress, to the lowest possible extent, a short-circuiting resulting from a deformation of a wire.

Since the insulating film shows a better bond to the resin than the conductor layer comprised of a metal, it is possible to suppress a lowering in a percentage of a bond to the resin even if the area ratio of the conductor layer is increased.

BRIEF DESCRIPTION OF THE DRAWINGS

FIG. 3 is a cross-sectional view showing a resin-sealed type IC device according to an embodiment of the present invention;

FIG. 5 is a cross-sectional view showing a resin-sealed type IC device according to another embodiment of the present invention;

FIG. 6 is a cross-sectional view showing a resin-sealed type IC device according to another embodiment of the present invention;

FIG. 7 is a cross-sectional view showing a resin-sealed type IC device according to another embodiment of the present invention;

FIG. 8 is a cross-sectional view showing a resin-sealed type IC device according to another embodiment of the present invention; and FIG. 9 is a cross-sectional view showing a resin-sealed type IC device according to another embodiment of the present invention.

DETAILED DESCRIPTION OF THE PREFERRED EMBODIMENTS

Figure 1:
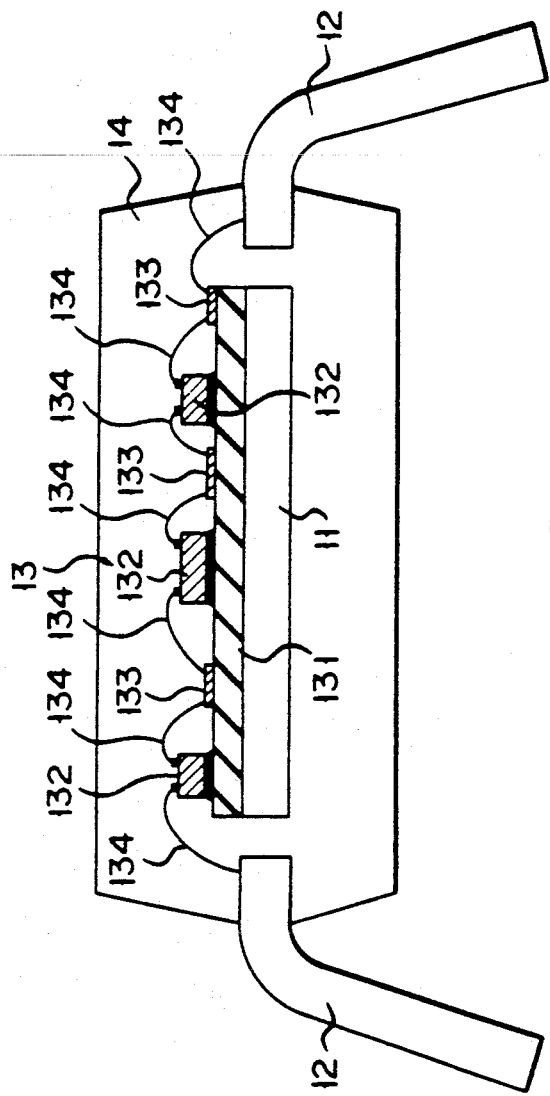
FIG. 1 is a cross-sectional view showing a conventional resin-sealed type IC device.
Figure 2:
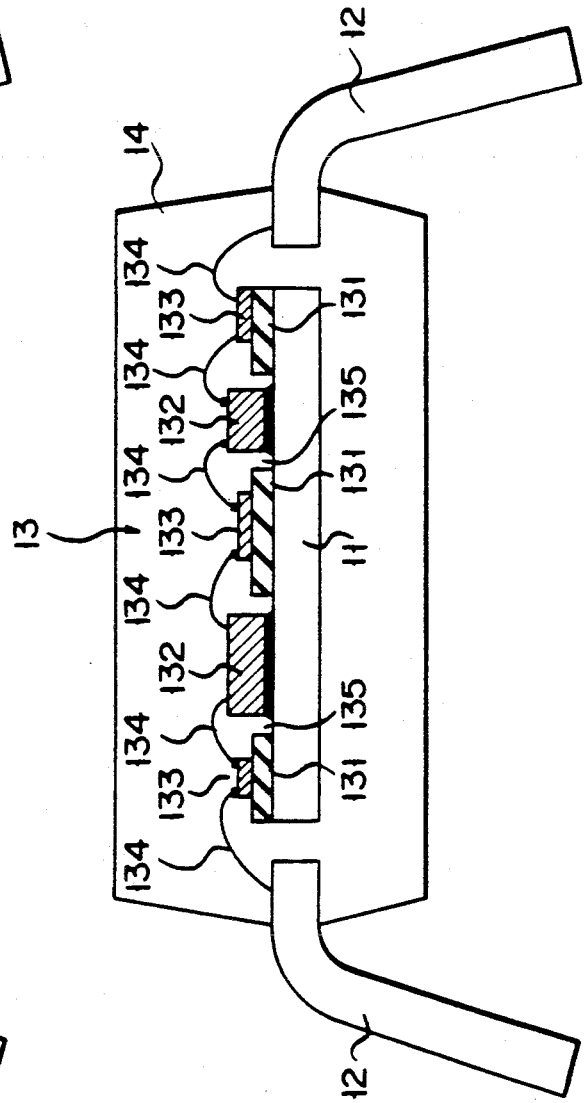
FIG. 2 is a cross-sectional view showing a conventional resin-sealed type IC device.

The embodiments of the present invention will be explained below by referring to the accompanying drawings.

FIG. 3 is a cross-sectional view showing an arrangement of a resin-sealed type semiconductor IC device.

In FIG. 3, reference numeral 31 shows an island constituting a lead frame; 32 denotes lead wires; 33, 34 denote hybrid type integrated circuits formed on island 31; 35 denotes a resin-sealed package for integrally sealing island 31, hybrid type integrated circuits 33, 34 and portions of lead wires 32. Hybrid type integrated circuit 33 includes insulating substrate 331 and a hybrid unit formed on insulating substrate 331. Insulating substrate 331 is bonded to island 31 by, for example, an adhesive agent. The hybrid unit has conductor interconnection layer 332, a plurality of semiconductor chips 333 and wires 335 provided on insulating substrate 331. Some of semiconductor chips 333 are bonded to insulating substrate 331 by, for example, an adhesive agent and others of semiconductor chips 333 are bonded by, for example, an adhesive agent, to island 31 through hole 334. Electrodes, conductor interconnection layer 332 and lead wire 32 are connected together in a proper array.

In the same way as hybrid type integrated circuit 33, hybrid unit 34 has insulating substrate 341, conductor interconnection layer 342, semiconductor chips 343 and wires 345. Some of semiconductor chips 343 are bonded to island 31 through hole 344 in insulating substrate 341. Insulating substrate 341 is formed on island 31 as a unit separate from insulating substrate 331 in hybrid type integrated circuit 33. Integrated circuits 33 and 34 are both bonded to island 31 and integrally sealed to provide resin-sealed type package 35.

The respective hybrid unit on insulating substrates 331 and 341 is so set that each perform a different circuit function.

As will be appreciated from the above, the embodiment of this invention is of such a type that the hybrid unit on insulating substrate 331 and that on insulating substrate 341 are integrally resin-sealed to provide a package. The resin-sealed type integrated circuit device thus manufactured has the following advantages:

(1) The respective circuit block can be formed on insulating substrates 331 and 341, in a distributed fashion, which are used in place of a single insulating substrate. This feature assures the ready identification of, for example, the input/output characteristics per circuit block of the device as well as the ease with which an associated testing apparatus is designed for the identification of the input/output characteristics. Furthermore, it is possible to provide a library with cells initially classified in which case a plurality of insulating substrates are used in place of a single insulating substrate. It is also possible to readily build a system with a proper combination of cells. For an optional customer's specification according to which a successful low cost can be achieved at a design stage, low-cost devices can be implemented, while assuring a shorter period of delivery.

(2) Individual insulating substrates 331, 341 can compactly be provided by selecting a proper number of insulating substrates. Also a compact device can be implemented which produces a pressure necessary for a firm bond to be made. It is possible to reduce an installation space for devices and to reduce installation costs involved. Since devices are readily set up on proper place on an assembly line, an automation line can be implemented in the existing manufacturing line.

(3) Because of a possible miniaturization of insulating substrates 331 and 341, pressure is exerted uniformly over a single whole insulating substrate when the insulating substrate is bonded to island 31, thus obtaining a firm bond of high reliability.

The following reliability factors are also taken into consideration.

(4) Because of the miniaturization of insulating substrates 331, 341 and of the small expansion and contraction of respective insulating substrates 331, 341 by a temperature change, it is possible to prevent an interconnection breakage and cracks, as well as a variation in the characteristics of semiconductor chips by stress distribution.

(5) Conductor interconnection layer 342 can be shortened because of the miniaturization of insulating substrates. It is, therefore, possible to prevent an increase in power loss resulting from an increase in impedance as well as a delay in the operation speed of the device.

Figure 4:
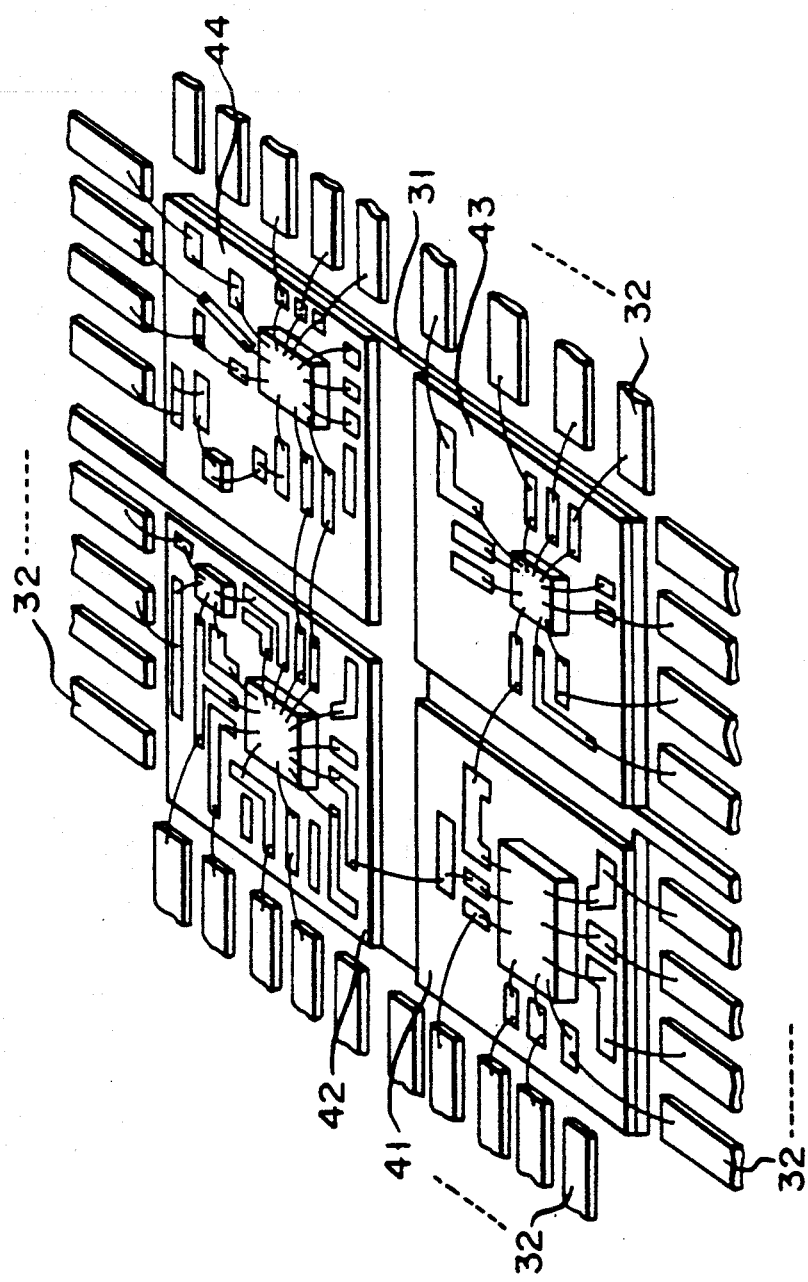
FIG. 4 is a cross-sectional view showing a resin-sealed type IC device according to another embodiment of the present invention.

Although the present invention has been explained above in more detail in connection with one embodiment, it is not restricted to this embodiment. For example, 2 or more insulating substrates may be provided according to the present invention. FIG. 4 shows four insulating substrates 41 to 44.

FIG. 5 shows a resin-sealed type IC device according to a second embodiment of the present invention. In FIG. 5, reference numeral 21 shows an island of a lead frame; 22 denotes lead wires; 23 denotes an integrated circuit bonded to island 21; 24 denotes a resin which integrally sealing island 21, base and portion of lead 22 and integrated circuit 23.

The aforementioned integrated circuit 23 is of a hybrid type which includes insulating substrate 231 and a plurality of semiconductor chips 232 all bonded to island 21 by, for example, an adhesive agent. Some of semiconductor chips 232 are bonded to insulating substrate 231 by, for example, an adhesive agent and others are adhesively bonded to island 21 through hole 233. Conductor interconnection layer 234 is formed on insulating substrate 231 Conductor interconnection layer 234, electrode on semiconductor chips 232, and lead wires 235 are connected together in proper array.

The features of the present invention will be explained below with reference to FIG. 5.

In the embodiment shown in FIG. 5, integrated circuit 23 is held within storage unit 25 made of an insulating material, such as polyimide or polyimide glass. Side wall 251 of storage section 25 is formed on insulating substrate 231 around insulating substrate 23 in which case top sheet 252 is adhesively bonded to side wall 25. Reinforcing and partition wall 253 is formed within storage unit 25. Storage unit 25 is so dimensioned that its inner surface is not in contact with semiconductor chip 232 and conductor interconnection layer 234.

Integrated circuit 23 is held within storage unit 25 and sealed by resin 24 from outside the storage unit.

The aforementioned embodiment has the following advantages:

(1) The moisture which is intruded into the interior of the package is prevented by storage unit 25 from reaching integrated circuit 23, thus enhancing the moisture-resistant characteristics.

When the long-duration reliability tests are conducted by applying vapor pressure on conventional DIP (dual in-line package) resin-sealed type integrated circuits, leakage current across the conductor interconnection layers, or across the conductor interconnection layer and the semiconductor chip, reaches a value of the order of 10 $\mu$A in 100 hours, thus producing a functional package. According to the present invention, no malfunction occurred in 200 hours under the same condition as that for the conventional devices.

(2) Since integrated circuit 23 is held within storage unit 25 in noncontacting fashion, semiconductor chips 232 can readily be mounted in an associated oscillation component parts, such as surface acoustic wave resonators.

(3) As will be apparent from the face that semiconductor circuit 23 is held within storage unit 25 in non-contacting fashion, conductor interconnection layer 234 directly never receives any thermal stress coming from outside the device, thus suppressing breakage or short-circuiting to a lowest possible extent.

Upon conducting long-duration reliability tests on the conventional resin-sealed type IC devices in a cycle of 65° C. (30 minutes)→425° C. (5 minutes)→200° C. (30 minutes), it has been found that breakages or short-circuitings occur in 100 cycles for the conventional resin-sealed type IC devices whereas, according to the present invention, breakages or short-circuitings never occur even after 200 cycles under the same conditions as those on the conventional devices.

(4) Since storage unit 25 is made of an insulating material, such as polyimide, a poor bond to resin 24 can be prevented despite the bulkiness of semiconductor chip 232 and an increase in the number of semiconductor chips 232 used. As a result, a decline in the bond strength of resin 24 upon the mount of a solder can be prevented on the surface mount package thus enhancing the moisture-resistant characteristics of the devices obtained.

(5) An apparatus for providing storage unit 25 can be set up on an assembly or manufacturing line without lowing any efficient productivity, so that resin-sealed type IC devices can be manufactured at low costs.

FIG. 6 is a cross-sectional view showing a resin-sealed type IC circuit according to a third embodiment of the present invention. In the third embodiment, reference numeral 21 shows an island constituting a lead frame; 22 denotes lead wires; 23 denotes an integrated circuit bonded to island 21; and 24 denotes a resin integrally sealing integrated circuit 23 and base end portions of lead wires.

Integrated circuit 23 is of a hybrid type and includes insulating substrate 231 adhesively bonded to island 21 and semiconductor chips 232. Some of semiconductor chips 232 are bonded to insulating substrate 231 by an adhesive agent and others are adhesively bonded to island 21 through hole 233. Conductor interconnection layer 234 is formed on insulating substrate 231. Conductor interconnection layer 234, electrodes on semiconductor chip 232 and lead wire 235 are connected by wires 235 in a proper array.

The features of the third embodiment of the present invention will be explained below.

In the arrangement shown in FIG. 6, insulating film 25 covers conductor interconnection layer 234 and has hole 26 at a location corresponding to an electrode connection portion of conductor interconnection layer 234. Wire 235 is connected to the electrode connection portion of conductor interconnection layer 234 through wire 235. Insulating layer 25 is formed of an insulating material, such as polyimide, and has a thickness of about 50 to 100 $\mu$m.

The covering of conductor interconnection layer 234 by insulating film 25, as well as the interconnection of wires 235, is performed as follows:

Insulating film 25 is initially prepared as a film having hole 26 at a location corresponding to electrode connection portion of conductor interconnection layer 234. The insulating film covers insulating substrate 234, while aligning the electrode connection portion with hole 26, and is adhesively bonded there, thus completing the covering of conductor interconnection layer 234. Then wire 235 is connected to the electrode connection portion of conductor interconnection portion through hole 26. In this way, the covering of conductor interconnection layer, as well as the interconnection of wires, is completed.

Hole 26 in the insulating film can be formed, for example, by an etching process using chemicals, a mechanical press or a process utilizing a photoreaction.

The adhesive agent for bonding the insulating film to conductor interconnection layer 234 may initially be coated on the insulating film.

The aforementioned embodiment can obtain the following advantages:

(1) The intrusion of moisture trapped within the package can be prevented, to the least possible extent, from reaching conductor interconnection layer 234. As a result, it is possible to reduce leakage current across conductor interconnection layer 234 and to avoid the malfunction of integrated circuit resulting from the intrusion of the moisture. From experiments conducted it has been confirmed that leakage current can be suppressed to a value of the order of nA, or further down to a value of the order of pA, against a current ordinary value of $\mu$A. It is, therefore, possible to extensively enlarge the application range of resin-sealed type IC devices. The suppression of the moisture thus achieved can reduce leakage current involved and implement the use of a high application voltage, so that it is possible to enlarge the application range of resin-sealed type IC devices.

(2) The presence of insulating film 25 can prevent a thermal stress, which comes from the outside of the IC devices, from being transmitted directly to conductor interconnection layer 234. It is thus possible to suppress a breakage or a short-circuiting, to the lowest possible extent, resulting from the thermal stress.

Due to the presence of insulating film 25, the direct contact of wire 235 with conductor interconnection layer 234 can also be prevented. The short-circuiting resulting from the deformation of wires 235 can also be suppressed to the lowest possible extent.

(3) Insulating film 25 is better than conductor interconnection layer 234, such as metal, with respect to the property of a bond to resin 24. Thus a fall in a percentage bond of resin 24 can be suppressed to the lowest possible extent even if the area ratio of conductor interconnection layer 234 becomes greater.

(4) Covering conductor interconnection layer 234 and forming insulating film 25 can readily be achieved by an ordinary film formation treatment. Thus resin-sealed type IC devices can be manufactured without lowering their production.

(5) In order to cover conductor interconnection layer 234 with insulating film 25 with hole 26, an insulating film with hole 26 is initially prepared so that it can be covered on conductor interconnection layer 234. For this reason, there is no risk that conductor interconnection layer 234 will be injured at the time of covering. It is also unnecessary to perform any complex etching control. As an alternative method it may be conceived that, for example, conductor interconnection layer 234 is covered with insulating film 25 and then hole 26 is formed in insulating film 25. According to this method, however, conductor interconnection layer 234 will be injured upon forming holes 26 and, when holes 26 are to be formed by an etching step, an etching rate is difficult to control so that conductor interconnection layer 234 may not be injured. According to the present invention, on the other hand, such a problem will not be involved because an insulating film with holes 26 is covered on conductor interconnection layer 234 which film has initially been prepared as insulating film 25.

(6) According to the present invention, conductor interconnection layer 234 is covered with insulating film 25 with holes 26 and then wire 235 is connected to an electrode connection portion of conductor interconnection layer 234. It is, therefore, possible to prevent a breakage in wires 235.

It may be conceived that, in order to obtain conductor interconnection layer 234 covered with an insulating film, wire 235 is connected to the electrode connection portion of conductor interconnection layer 234 and then an insulating material is coated on conductor interconnection layer 234. In this method, however, there is a high risk that a breakage will occur upon coating an insulating material on conductor interconnection layer 234. In the embodiment, conductor interconnection layer 234 is covered with insulating film 25 with hole 26, thus presenting no such problem as set forth above.

In the third embodiment the present invention has been explained as being applied to resin-sealed type IC devices equipped with a hybrid type integrated circuit, while in the fourth embodiment the present invention has been explained as being applied to resin-sealed type IC devices equipped with a monolithic type integrated circuit.

FIG. 7 shows a resin-sealed type IC device according to another embodiment of the present invention.

In the embodiment shown in FIG. 7, reference numeral 31 shows an island constituting a lead frame; 32 denotes lead wires; and 33 denotes a semiconductor chip bonded by an adhesive agent to island 31.

Electrodes on semiconductor chip 33 are electrically connected to lead wires 32 in which case a longer distance is left between lead wires 32 and electrodes on semiconductor chip 33. As will be appreciated from FIG. 7, the electrode is connected to lead wire 32, 20 through pad 31 between island 31 and lead wire 32, in place of being connected directly to the lead wire. Pad 34 is formed on support pedestal 35 made of, for example, an insulating material, and connected to lead wire 32 and semiconductor chip 33 through a corresponding wire. Pad 34, together with semiconductor chip 33, etc., is integrally sealed with the resin.

In the fourth embodiment, pad 34 is covered with insulating film 39 with electrode connection portion 38 left over pad 34.

The aforementioned arrangement, as in the case of the third embodiment, can obtain the advantage capable of avoiding a possible short-circuiting relative to adjacent pad 38 which results from moisture intruded there.

The insulating film as set forth above can be applied to not only the conductor interconnection layer, overlying the insulating substrate, but also the conductor layer, in general, such as the aforementioned pad, which is sealed with a resin.

Although, in the aforementioned explanation, the conductor layer except for the electrode connection portion can all be covered with an insulating film, the covered layer can be reduced within a range of the present invention.

In accordance with the invention, the lead frame has a plurality of island portions and a plurality of electric lead portions positioned around the plurality of island portions. FIGS. 8 and 9 show two other embodiments of the present invention. In FIGS. 3, 8 and 9 like reference numerals refer to like structures. Preferably, the lead frame includes island portions, such as islands 31, and electric lead portions, such as lead wires 32. The embodiment shown in FIG. 8 is similar to that shown in FIG. 3, except that the lead frame has a plurality of islands 31 and insulating substrates 331a and 341a may act as circuit elements in addition to electrically insulating circuit elements mounted thereon. Insulating substrates 331 and 341 of FIG. 3 may also act as circuit elements.

Islands 31 are electrically insulated from each other since they are separated within the device. Thus, the resin sealed integrated circuit of the present invention can have a number of functions.

The corresponding circuit elements located on each island 31 are also separated and electrically insulated so that circuit elements mounted on different islands can be operated at different potentials. The separation of islands 31 reduces heat distortion. Reduced heat distortion reduces the frequency of cracking of the devices. These advantages result in more durable multi-hybrid integrated circuit devices with improved performance reliability and higher yield.

Since islands 31 are separated so that circuit elements mounted on different islands are electrically isolated, the embodiment of FIG. 8 may be modified by eliminating insulating substrates 331a and 341a. FIG. 9 illustrates an embodiment of the invention which does not require insulating substrates 331a and 341a for insulating purposes or as circuit elements.

What is claimed is:

1. A multi-hybrid integrated circuit device with a resin-sealed type package comprising:
    a lead frame having a plurality of separated island portions and a plurality of electrical lead portions positioned around said plurality of island portions;
    a plurality of hybrid units at least one of which is mounted on each of said plurality of island portions, each of said hybrid units having a circuit board, said circuit board including an insulating substrate and conductive interconnecting layers printed with a predetermined pattern formed thereon and a plurality of active or passive elements located over the circuit board and connected with corresponding interconnecting layers;
    a plurality of fine wires electrically connected to said hybrid units and said lead portion of said lead frame; and
    resin mold for sealing said plurality of island portions, inner portions of said lead portions, the hybrid units and the fine wires as an integral unit.

2. The resin-sealed type integrated circuit device according to claim 1, in which said plurality of hybrid units are surrounded, in a non-contacting fashion, by a storage unit formed of an insulating material.

3. The resin-sealed type integrated circuit device according to claim 1, in which a conductor interconnection layer of said hybrid units is covered with an insulating film, the insulating film having a hole at a location corresponding to an electrode connection portion of said conductor interconnection layer.

4. The resin-sealed type integrated circuit device according to claim 1, in which said plurality of hybrid units each have an individual different function.

5. The resin-sealed type integrated circuit device according to claim 1, in which said plurality of hybrid units constitute a hybrid type integrated circuit.

6. The resin-sealed type integrated circuit device according to claim 1, in which said hybrid units each comprise an insulating substrate formed on said plurality of island portions, a conductor interconnection layer formed on the insulating substrate, a semiconductor chip, and wires one of which creates an electrical connection between said conductor interconnection layer and said semiconductor chip and between said conductor interconnection layer and a lead wire.

* * * * *

UNITED STATES PATENT AND TRADEMARK OFFICE
CERTIFICATE OF CORRECTION

PATENT NO. : 5,083,189
DATED : January 21, 1992
INVENTOR(S) : Hiromichi Sawaya

It is certified that error appears in the above-identified patent and that said Letters Patent is hereby corrected as shown below:

Claim 1, column 12, line 9, before, "resin" insert --a--.

Signed and Sealed this

Twenty-ninth Day of June, 1993

Attest:

MICHAEL K. KIRK

Attesting Officer    Acting Commissioner of Patents and Trademarks